(12) United States Patent
Emerson

(10) Patent No.: US 7,368,368 B2
(45) Date of Patent: May 6, 2008

(54) MULTI-CHAMBER MOCVD GROWTH APPARATUS FOR HIGH PERFORMANCE/HIGH THROUGHPUT

(75) Inventor: David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 396 days.

(21) Appl. No.: 10/920,555

(22) Filed: Aug. 18, 2004

(65) Prior Publication Data
US 2006/0040475 A1 Feb. 23, 2006

(51) Int. Cl.
H01L 21/00 (2006.01)
(52) U.S. Cl. ............... 438/505; 438/478; 438/483; 438/488; 438/491; 438/503; 438/680; 438/763; 438/782; 257/E21.17
(58) Field of Classification Search ............ 438/478, 438/503, 483, 491, 488, 680, 505, 763, 782; 257/E21.17
See application file for complete search history.

(56) References Cited

U.S. PATENT DOCUMENTS

| | | | |
|---|---|---|---|
| 4,048,955 A | | 9/1977 | Anderson |
| 4,438,723 A | * | 3/1984 | Cannella et al. ............ 118/718 |
| 4,951,601 A | * | 8/1990 | Maydan et al. ............. 118/719 |
| 5,338,362 A | | 8/1994 | Imahashi |
| 5,351,255 A | * | 9/1994 | Schetzina ................ 372/45.01 |
| 5,804,834 A | * | 9/1998 | Shimoyama et al. ......... 257/22 |
| 5,932,896 A | * | 8/1999 | Sugiura et al. ............... 257/94 |
| 6,030,459 A | | 2/2000 | Kawaura |
| 6,153,524 A | * | 11/2000 | Henley et al. ............. 438/691 |
| 6,162,010 A | | 12/2000 | Ishizawa et al. |
| 6,316,361 B1 | | 11/2001 | Hansson |
| 6,323,053 B1 | * | 11/2001 | Nishikawa et al. ........... 438/46 |
| 6,373,077 B1 | | 4/2002 | Edmond et al. |
| 6,392,979 B1 | * | 5/2002 | Yamamoto et al. ......... 369/121 |
| 6,399,473 B1 | * | 6/2002 | Fischer et al. ............. 438/602 |
| 6,430,458 B1 | | 8/2002 | Mosely et al. |
| 6,541,353 B1 | * | 4/2003 | Sandhu et al. ............. 438/478 |
| 6,579,361 B2 | | 6/2003 | Preti |
| 6,586,340 B2 | | 7/2003 | Lee et al. |

(Continued)

OTHER PUBLICATIONS

Ying-Lan Chang et al; Study of Mg diffusion during metalorganic chemical vapor deposition of GaN and AlGaN; Applied Physics Letters; Feb. 1, 1999; vol. 74, No. 5; American Institute of Physics.

*Primary Examiner*—Michelle Estrada
*Assistant Examiner*—Jarrett J Stark
(74) *Attorney, Agent, or Firm*—Summa, Allan & Additon, P.A.

(57) ABSTRACT

In one embodiment the present invention is a method of conducting multiple step multiple chamber chemical vapor deposition while avoiding reactant memory in the relevant reaction chambers. The method includes depositing a layer of semiconductor material on a substrate using vapor deposition in a first deposition chamber followed by evacuation of the growth chamber to reduce vapor deposition source gases remaining in the first deposition chamber after the deposition growth and prior to opening the chamber. The substrate is transferred to a second deposition chamber while isolating the first deposition chamber from the second deposition chamber to prevent reactants present in the first chamber from affecting deposition in the second chamber and while maintaining an ambient that minimizes or eliminates growth stop effects. After the transferring step, an additional layer of a different semiconductor material is deposited on the first deposited layer in the second chamber using vapor deposition.

41 Claims, 3 Drawing Sheets

U.S. PATENT DOCUMENTS

| | | |
|---|---|---|
| 6,630,690 B2 | 10/2003 | Edmond et al. |
| 6,740,585 B2 * | 5/2004 | Yoon et al. ................. 438/680 |
| 2001/0013313 A1 * | 8/2001 | Droopad et al. ............ 117/200 |
| 2002/0034595 A1 | 3/2002 | Tometsuka |
| 2003/0113187 A1 | 6/2003 | Lei et al. |
| 2003/0207522 A1 | 11/2003 | Lee et al. |
| 2005/0040413 A1 * | 2/2005 | Takahashi et al. ............ 257/96 |

* cited by examiner

MULTI-CHAMBER MOCVD GROWTH APPARATUS FOR HIGH PERFORMANCE/HIGH THROUGHPUT

BACKGROUND OF THE INVENTION

The present invention is related to vapor deposition growth of semiconductor materials and to associated apparatus and methods. More specifically, the present invention is related to a wafer processing apparatus and a wafer processing method for reducing reactant memory in the relevant apparatus chambers.

Crystal growth from vapor is employed in semiconductor technology, in particular, for producing epitaxial layers on semiconductor wafers. The term epitaxy typically describes the growth of a monocrystalline layer on the planar boundary surface of a monocrystalline substrate, generally a substrate wafer of a semiconductor material.

Epitaxial growth is often carried out using chemical vapor deposition (CVD) in CVD reactors. In such processes, the semiconductor wafer is first heated and then exposed to a gas mixture, referred to as a process gas. The process gas mixture typically consists of a source gas, a carrier gas, and, where appropriate, a dopant gas. The source gas (or gases) provides the elements that form the desired semiconductor; e.g. trimethyl gallium and ammonia to form gallium nitride. The dopant gases carry (typically as compounds) elements that add p or n-type conductivity to the epitaxial layer; e.g. magnesium to obtain p-type gallium nitride. The source and dopant gases react on or near the hot substrate surface to form the desired epitaxial layer.

In a typical CVD process, reactant gases (often diluted in a carrier gas) at room temperature enter the reaction chamber. The gas mixture is heated as it approaches the deposition surface, heated radiatively, or placed upon a heated substrate. Depending on the process and operating conditions, the reactant gases may undergo homogeneous chemical reactions in the vapor phase before striking the surface. Near the surface thermal, momentum, and chemical concentration boundary layers form as the gas stream heats, slows down due to viscous drag, and the chemical composition changes. Heterogeneous reactions of the source gases or reactive intermediate species (formed from homogeneous pyrolysis) occur at the deposition surface forming the deposited material. Gaseous reaction by-products are then transported out of the reaction chamber.

Because a p-n junction is a fundamental element in many semiconductor devices, epitaxial layers of opposite conductivity type are often grown consecutively to one another on the substrate, typically by changing the composition of the dopant gas at a desired point during the growth process. Similarly, when heterostructures are produced using CVD, the composition of the source gases is similarly changed.

Such changes in source or dopant gas composition can lead to a problem referred to as "reactant memory." The term "reactant memory" describes the undesired contamination of the process gas with source or dopant compositions or elements that remain in the chamber from previous deposition steps. At elevated temperatures, dopant and source compositions are capable of sticking to the reactor walls and potentially re-evaporating during following epilayer depositions. When, for example, dopants re-evaporate, the possibility exists that the dopants will be included or incorporated in the subsequent epi layers. In such layers the dopants can act as impurities or can change the electronic characteristics of the layers and the subsequent devices. This effect is often more pronounced for aluminum and boron than for nitrogen in SiC epitaxy. The effect is also pronounced for telluriumand zinc in GaAs epitaxy and for magnesium in GaN epitaxy.

Doping control is intricate in the epitaxial growth procedure. The background doping can be limited by using purified gases, and high-grade materials in the critical parts of the reactor. Memory effects from earlier growth steps where dopants have been intentionally introduced are also problematic.

Several attempts have been made to overcome the problems associated with reactant memory. One such attempted solution is site-competition epitaxy. Site-competition epitaxy is based on the competition between, for example, SiC and dopant source gases for the available substitutional lattice sites on the growing SiC crystal surface. In this case, dopant incorporation is controlled by appropriately adjusting the Si:C ratio within the growth reactor to affect the amount of dopant atoms incorporated into these sites, either carbon-lattice sites (C sites) or silicon lattice sites (Si sites), located on the active growth surface of the SiC crystal. This technique has also been utilized for arsenide and phosphide growth. By using site-competition epitaxy, the impurity level of the epilayer can be controlled by adjusting the C:Si ratio, while the n-type dopant nitrogen is increased at a low C:Si ratio. Hence, the C:Si ratio must be chosen to limit the domination dopant to grow low-doped material, while intentionally doped material must be grown under the C:Si ratio most suited for the dopant of choice.

Previous methods for counteracting reactant memory have also included cleaning the reactor after each deposition, baking out the reactor, and burying the dopant by re-coating the reactor walls. Another method for controlling the effect includes etching the reactor walls after each doped layer has been grown, for example using hydrogen or a hydrochloric acid. Combinations of an etch and an active C:Si ratio control have also been utilized to avoid the problems of reactant memory. These solutions, however, suffer from several drawbacks. Each method is time-consuming and reduces output, and adds additional processing steps to the technique. These methods may also result in growth stop effects such as poor adhesion between layers. Moreover, the various proposed solutions to the problem of reactant memory can also be costly additions to production of the desired devices.

Defect control has been considerably improved by optimizing the cleaning procedure before growth, both ex-situ before loading, and in-situ as part of the growth sequence. Reactant memory has not, however, been sufficiently reduced using these techniques to allow for efficient low doping epitaxial growth of multiple layers in some processes. It would therefore be desirable to develop an improved and more efficient technique for epitaxial growth while avoiding defects caused by reactant memory.

SUMMARY OF THE INVENTION

In one embodiment the present invention is a method of conducting multiple step multiple chamber chemical vapor deposition while avoiding reactant memory in the relevant reaction chambers. The method includes depositing a layer of semiconductor material on a substrate using vapor deposition in a first deposition chamber followed by evacuation of the growth chamber to reduce vapor deposition source gases remaining in the first deposition chamber after the deposition growth and prior to opening the chamber. The substrate is transferred to a second deposition chamber while isolating the first deposition chamber from the second deposition chamber to prevent reactants present in the first chamber from affecting deposition in the second chamber and while maintaining an ambient that minimizes or eliminates growth stop effects. After the transferring step, an additional layer of a different semiconductor material is deposited on the first deposited layer in the second chamber using vapor deposition.

In a second embodiment, the invention is a method of conducting multiple step multiple semiconductor chemical vapor deposition while avoiding reactant memory in the relevant reaction chambers. The method includes depositing a layer of a first semiconductor material on a substrate using vapor deposition in a first deposition chamber, followed by evacuation of the growth chamber to reduce vapor deposition source gases remaining in the first deposition chamber following the deposition growth and prior to opening the chamber. The substrate is transferred to a second deposition chamber while isolating the first deposition chamber from the second deposition chamber to prevent reactants present in the first chamber from affecting deposition in the second chamber and while maintaining an ambient that minimizes or eliminates growth stop effects. After the transferring step, a second layer of a different semiconductor material is deposited on the substrate in the second chamber using vapor deposition. After the second layer is deposited and prior to opening the second deposition chamber, the vapor deposition source gases are evacuated from the second deposition chamber to reduce vapor deposition source gases remaining in the second deposition chamber following the deposition growth and the substrate is transferred to the first deposition chamber while isolating the second deposition chamber from the first deposition chamber to prevent reactants present in the second chamber from affecting deposition in the first deposition chamber and while maintaining an ambient that minimizes or eliminates growth stop effects. After the transferring step, an additional layer of the first semiconductor material is deposited on the second deposited layer in the first chamber using vapor deposition.

In another embodiment, the invention is an apparatus for reducing reactant memory during chemical vapor deposition growth of semiconductor materials. The apparatus includes two vapor deposition growth processing chambers for conducting chemical vapor deposition of a semiconductor material on a substrate; and a transfer chamber between and in communication with said deposition chambers for conveying a substrate between said deposition chambers without passing the substrate directly from one of said chambers to the other. The apparatus further includes two process isolation valves each of which is in communication with one of the respective deposition chambers and both of which are in communication with the transfer chamber for isolating said deposition chambers from said transfer chamber during vapor deposition growth in said chambers. The apparatus also includes means for conveying a substrate from one of the deposition chambers to the transfer chamber and thereafter from the transfer chamber to the other of the deposition chambers.

In a different embodiment, an apparatus for reducing reactant memory during chemical vapor deposition growth of semiconductor materials is provided. The apparatus includes at least one vapor deposition processing chamber for conducting chemical vapor deposition of n-type epitaxial layers on a substrate or previously deposited layer and at least one vapor deposition processing chamber for conducting chemical vapor deposition of p-type epitaxial layers on a substrate or previously deposited layer. The apparatus also includes at least one transfer chamber for transferring a substrate between said vapor deposition processing chambers and at least two process isolation valves, each of which is in communication with one of said respective deposition chambers and both of which are in communication with said transfer chamber for isolating said deposition chambers from said transfer chamber during vapor deposition growth in said chambers. The apparatus also includes means for transferring a substrate from one of said deposition chambers to said transfer chamber and thereafter from said transfer chamber to other of said deposition chambers.

BRIEF DESCRIPTION OF THE DRAWINGS

The present invention will be understood more fully from the detailed description given here below and from the accompanying drawings of the preferred embodiments of the invention. The drawings, however, are not intended to imply limitation of the invention to a specific embodiment, but are for explanation and understanding only.

DETAILED DESCRIPTION OF ILLUSTRATIVE EMBODIMENTS

Figure 1:
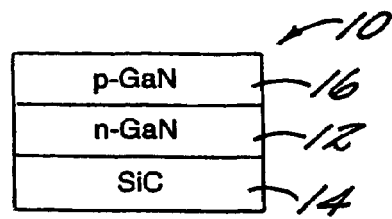
FIG. 1 is a schematic depiction of a processed wafer formed in accordance with one embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that references to a "wafer" includes one wafer as well as multiple wafers, and that wafer carriers may optionally be included in any reference to wafers. Moreover, the wafers may be transferred to different wafer carriers throughout the processing steps.

The invention described herein is a wafer processing apparatus and a wafer processing method for reducing reactant memory in the relevant apparatus chambers. FIG. 1 depicts a representative processed wafer, for example a semiconductor device precursor 10, formed in accordance with one embodiment of the invention. As illustrated in FIG. 1, an n-GaN 12 layer is located on a SiC substrate 14. A p-GaN layer 16 is located on the n-GaN layer 12. The depicted structure is merely representative of a structure that may be grown in accordance with the present invention, and is not intended to limit the resulting structures in any manner. Specifically, the resulting structure is not limited to a SiC substrate, but may also include a GaN or sapphire substrate or other substrates known in the art. Similarly, the layers grown on the substrate may be different than those depicted. Suitable layers include Group III-V layers as well as others known in the art and are not limited to doped layers. As used herein, the term "substrate" refers to a substrate as well as a substrate having one or more deposited layers of one or more different materials thereon. The terms "substrate" and "wafer" are used interchangeably herein throughout.

Although structures that incorporate two or three layers (n and p-type) of gallium nitride are illustrated, those familiar with and of ordinary skill in this art will recognize that the device can include one or more quantum wells, or superlattice structures or both and that the active layer or layers can include a greater range of the Group III-V compounds than gallium nitride standing alone. These variations, however, need not be elaborated in detail in order to clearly understand the invention, and thus, they are not discussed in detail herein. Thus, the relevant portions of more elaborate devices may also be referred to as, "active layers," "diode portions," "diode regions," or "diode structures," without departing from the scope of the present invention.

For numerous reasons, a buffer layer is often included as part of the structure between the silicon carbide substrate and the first gallium nitride (or other Group III-V) layer. In many cases, the buffer layer can comprise aluminum nitride (AlN), a fixed composition of AlGaN or a graded layer of aluminum gallium nitride (AlGaN) that progresses from a higher aluminum concentration near the silicon carbide substrate to a higher gallium nitride concentration at its interface with the gallium nitride epitaxial layer. Suitable buffer layers are also disclosed in commonly owned U.S. Pat. Nos. 6,373,077 and 6,630,690, which are incorporated herein by reference. Other structural portions that can be incorporated into devices of this type and with which the invention is particularly suitable include superlattice structures for enhancing the overall crystal stability of the device, quantum wells for enhancing the output of light or tuning it to a particular frequency, or multiple quantum wells for enhancing the brightness of the device by providing the additional number of active layers and the relationships between them. In addition, it may be desirable to passivate the exposed surfaces of the epitaxial layers of the device for environmental protection.

Figure 2A:
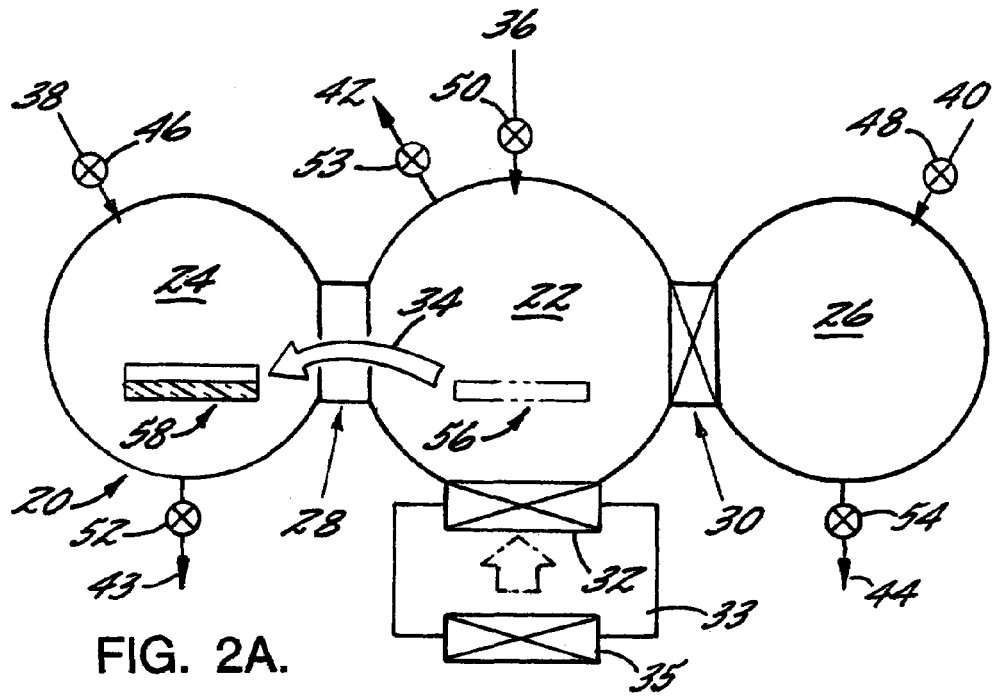
FIGS. 2A and 2B are schematic depictions of a two-chambered apparatus in accordance with the present invention and a method of use.
Figure 2B:
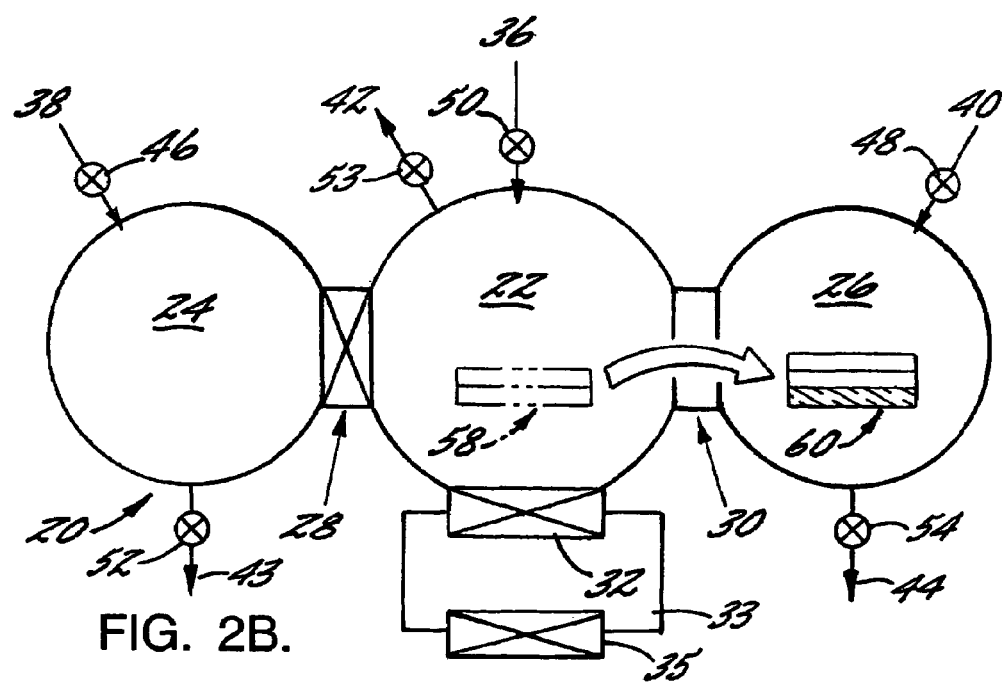

FIGS. 2A and 2B depict a schematic of an apparatus 20 according to the present invention for forming multilayer devices and a method of its use. The apparatus includes a transfer chamber 22 in communication with two chemical vapor deposition chambers 24, 26. The apparatus 20 also includes two isolation valves 28, 30, each in communication with one CVD chamber 24, 26 and the transfer chamber 22; a loading valve 32 in communication with the transfer chamber 22; and a load lock chamber 33. The load lock chamber 33 may be a glove box purged with dry gas (i.e., Ar, $N_2$) or a vacuum chamber that can be purged prior to opening the loading valve 32 or a combination of the two. An input valve 35 in communication with the load lock chamber 33 is included, as well as a transfer means 34 and at least one gas inlet 36. The isolation valves 28, 30, the loading valve 32, and the input valve 35 are capable of being selectively opened and closed, allowing the chambers to be isolated one from the other and from the outside atmosphere. The apparatus 20 depicted in FIGS. 2A and 2B includes 3 gas inlets 36, 38, 40. Each gas inlet 36, 38, 40 preferably includes a valve 46, 48, 50 to open or close the inlet as desired. Gas inlets include, but are not limited to, a transfer chamber inlet 36 and reaction chamber inlets 38, 40. The apparatus also preferably includes a transfer chamber exhaust 42 and reaction chamber exhausts 43, 44. Each exhaust 42, 43, 44 preferably includes a valve 52, 53, 54 to open or close the exhaust 42, 43, 44 as desired. It should be noted that the apparatus could also contain additional chambers, such as deposition chambers, cooling chambers, or other chambers known in the art. Moreover, the apparatus could also include fewer inlets and exhausts than depicted in FIGS. 2A and 2B. Similarly, the apparatus could include more inlets and exhausts than depicted.

In one embodiment of the present invention, a wafer 56, for example a SiC wafer, is placed in a load lock chamber 33 via an input valve 35 while the loading valve 32 remains in a closed position. The wafer 56 may optionally be located on a wafer carrier. After the wafer 56 is placed in the load lock chamber 33, the input valve 35 is closed, the load lock chamber 33 is evacuated or purged with, for example, $N_2$, to remove $O_2$ and moisture, along with as many other impurities as possible, from the load lock chamber 33. The wafer 56 is then placed in a transfer chamber 22 via a loading valve 32 while the isolation valves 28, 30 are closed. More than one wafer may be transferred at this time. As depicted in FIG. 2A, a second chamber 26 is isolated from the transfer chamber 22 by closing the isolation valve 30, and the wafer 56 is transferred to the first chamber 24 while maintaining an appropriate ambient as discussed herein. Means for transferring the wafer include an arm. After the wafer 56 is transferred to the first chamber 24, the isolation valve 28 between the first chamber 24 and the transfer chamber 22 is preferably closed during processing. An epitaxial layer, for example an n-type epitaxial layer, is then deposited on the wafer 56 by chemical vapor deposition in the first chamber 24.

After deposition, the first chamber 24 is purged to reduce vapor deposition source gases and dopants remaining in the chamber 24 after deposition and the processed substrate 58 is transferred to the transfer chamber 22 through the isolation valve 28 while minimizing growth stop effects. As used herein, the term "purged" includes the step of evacuating the chamber as well as the step of replacing one gas with another. Growth stop effects are minimized by utilizing appropriate ambients, such as $H_2$, $N_2$, noble gases, or Group V gases. Pressures suitable to vapor deposition growth techniques may also be utilized. During transfer, the isolation valve 30 between the transfer chamber 22 and the second chamber 26 remains closed to prevent relevant dopant gases present in the first chamber 24 from entering the second chamber 26 and affecting later deposition in the second chamber 26. The minimization of growth stop effects occurs by maintaining the substrate in an ambient that minimizes growth stop effects. The growth stop effects are preferably minimized by maintaining positive flow of reactant gases throughout the apparatus.

The deposition of a second epitaxial layer is depicted in FIG. 2B. As seen in the figure, the isolation valve 28 between the first chamber 24 and the transfer chamber 22 is closed and the isolation valve 30 between the transfer chamber 22 and the second chamber 26 is opened. The wafer 58 is then transferred via a transferring means 34 into the second chamber 26. After the wafer 58 is transferred to the second chamber 26, the isolation valve 30 between the second chamber 26 and the transfer chamber 30 is preferably closed during epitaxial growth. An epitaxial layer, for example a p-type epitaxial layer, is then deposited on the first epitaxial layer by chemical vapor deposition in the second chamber 26.

After deposition, the second chamber 26 is purged to reduce the presence of vapor deposition gases and dopants remaining in the chamber 26 after deposition, and the resulting device 60 is transferred to the transfer chamber 22 through the isolation valve 30 while minimizing growth stop effects. Growth stop effects are minimized by utilizing appropriate ambients, such as $H_2$, $N_2$, noble gases, or Group V gases. Pressures suitable to vapor deposition growth techniques may also be utilized. During transfer, the isolation valve 28 between the transfer chamber 22 and the first chamber remains closed to prevent relevant dopant gases present in the second chamber 26 from entering the first chamber 24 and affecting later deposition in the first chamber 24.

When the desired number of growth steps is completed, the processed wafer is transferred from the transfer chamber 22 to the load lock chamber 33 via the loading valve 32 and the loading valve 32 is closed. The input valve 35 remains closed during this transfer. After the load lock chamber 33 has been returned to the appropriate atmosphere, the input valve 35 is opened and the processed wafer is removed from the load lock chamber 33.

Figure 3:
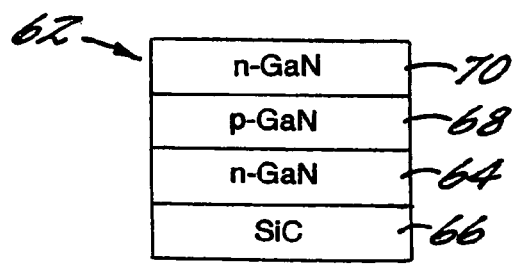
FIG. 3 is a schematic depiction of a processed wafer formed in accordance with another embodiment of the present invention.

FIG. 3 depicts a representative multilayer structure 62, such as a semiconductor device precursor, grown in accordance with an additional embodiment of the present invention. As with FIG. 1, FIG. 3 is merely representative of a structure that may be grown in accordance with the present invention, and is not intended to limit the resulting devices in any manner. Specifically, the resulting structure is not limited to a SiC substrate, but may also include a GaN or sapphire substrate or other substrates known in the art. Similarly, the layers grown on the substrate may be different than those depicted. Suitable layers include Group III-V layers as well as others known in the art and are not limited to doped layers. As depicted in FIG. 3, an n-GaN layer 64 is located on a SiC substrate 66. A p-GaN layer 68 is located on the n-GaN 64 layer and an additional n-GaN layer 70 is located on the p-GaN layer 68.

In one embodiment, the additional n-GaN layer 70 depicted in FIG. 3 may be formed in the apparatus of FIGS. 2A and 2B by transferring the processed substrate 60 from the transfer chamber 22 through the isolation valve 28 into the first chamber 24 while isolating the second chamber 26 from the transfer chamber 22. After transfer, a deposition step may be conducted in the first chamber 24 to grow the desired layer onto the processed wafer 60.

After deposition, the first chamber 24 is purged to reduce the presence of vapor deposition gases and dopants remaining in the chamber 24 after deposition, and the substrate is transferred to the transfer chamber 22 through the isolation valve 28 while minimizing growth stop effects. Growth stop effects are minimized by utilizing appropriate ambients, such as $H_2$, $N_2$, noble gases, or Group V gases. Pressures suitable to vapor deposition growth techniques may also be utilized. During transfer, the isolation valve 30 between the transfer chamber 22 and the second chamber 26 remains closed to prevent relevant dopant gases present in the first chamber 24 from entering the second chamber 26 and affecting later deposition in the second chamber 26.

Figure 4A:
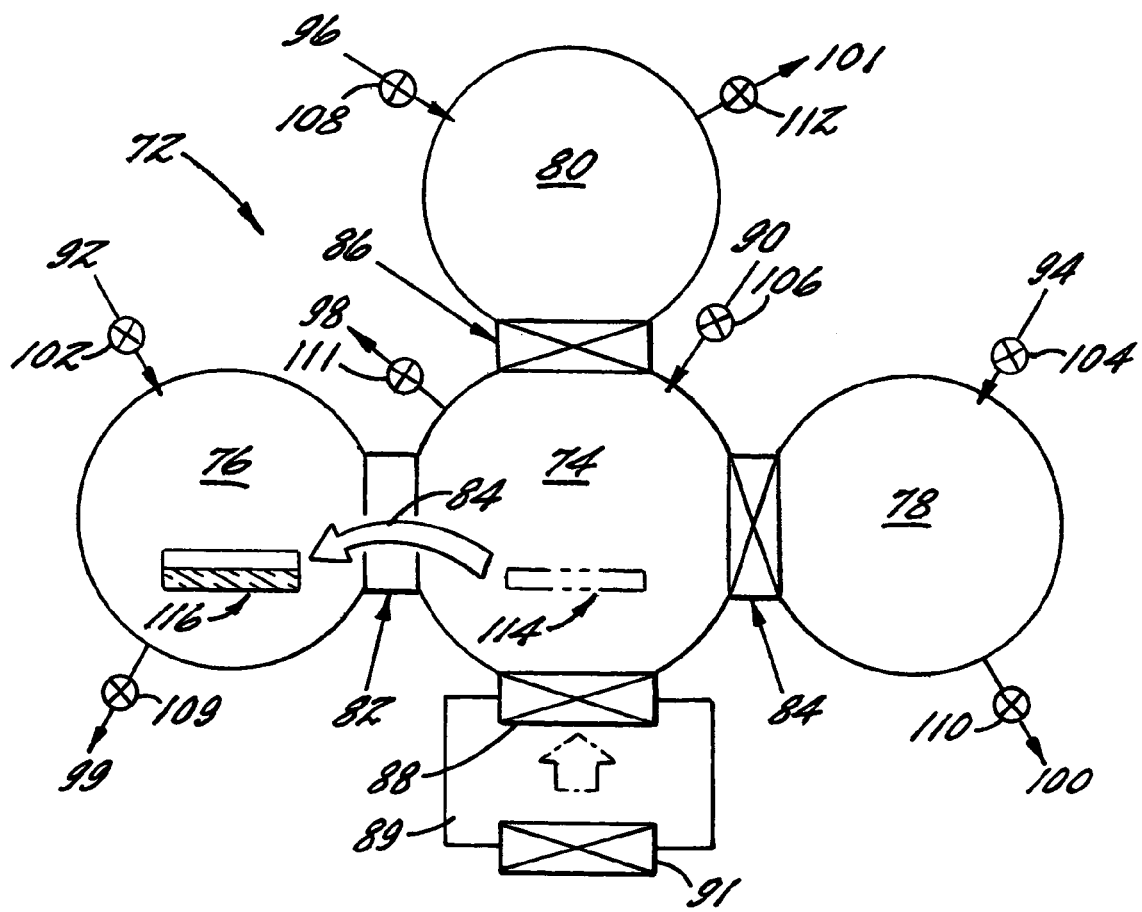
FIGS. 4A-4C are schematic depictions of a three-chambered apparatus in accordance with the present invention, and a method of use.
Figure 4B:
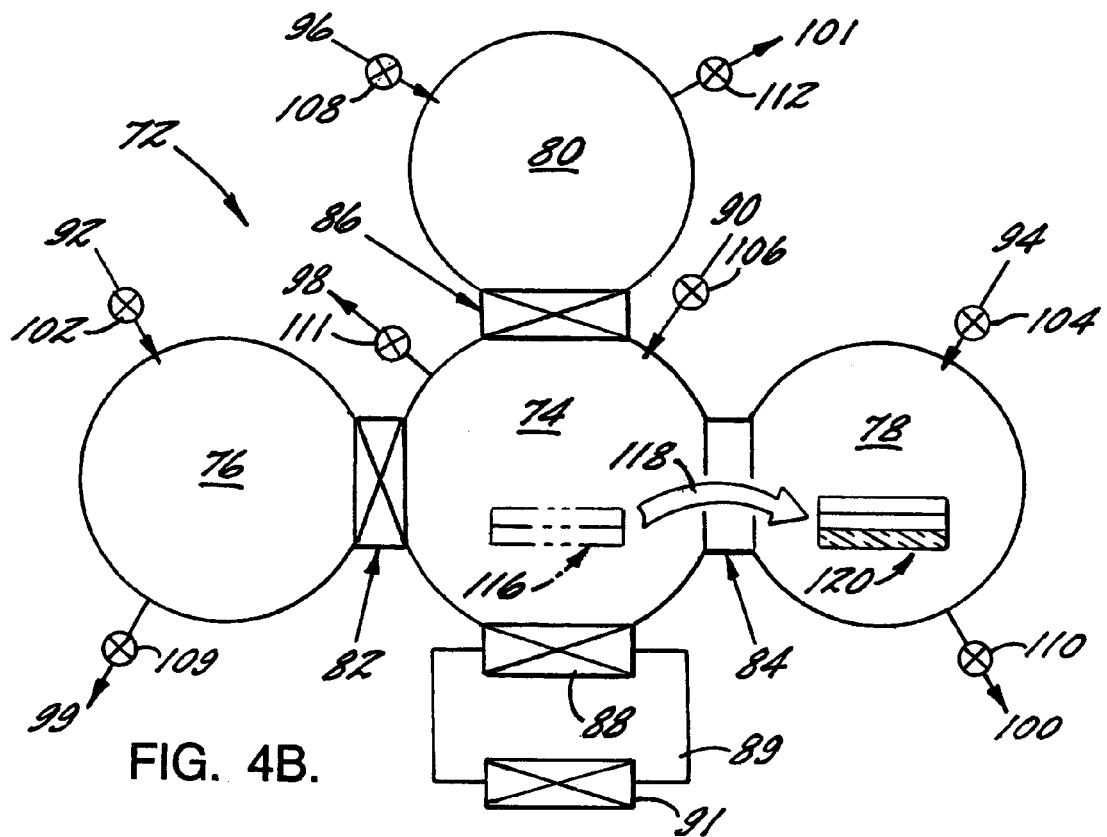
Figure 4C:
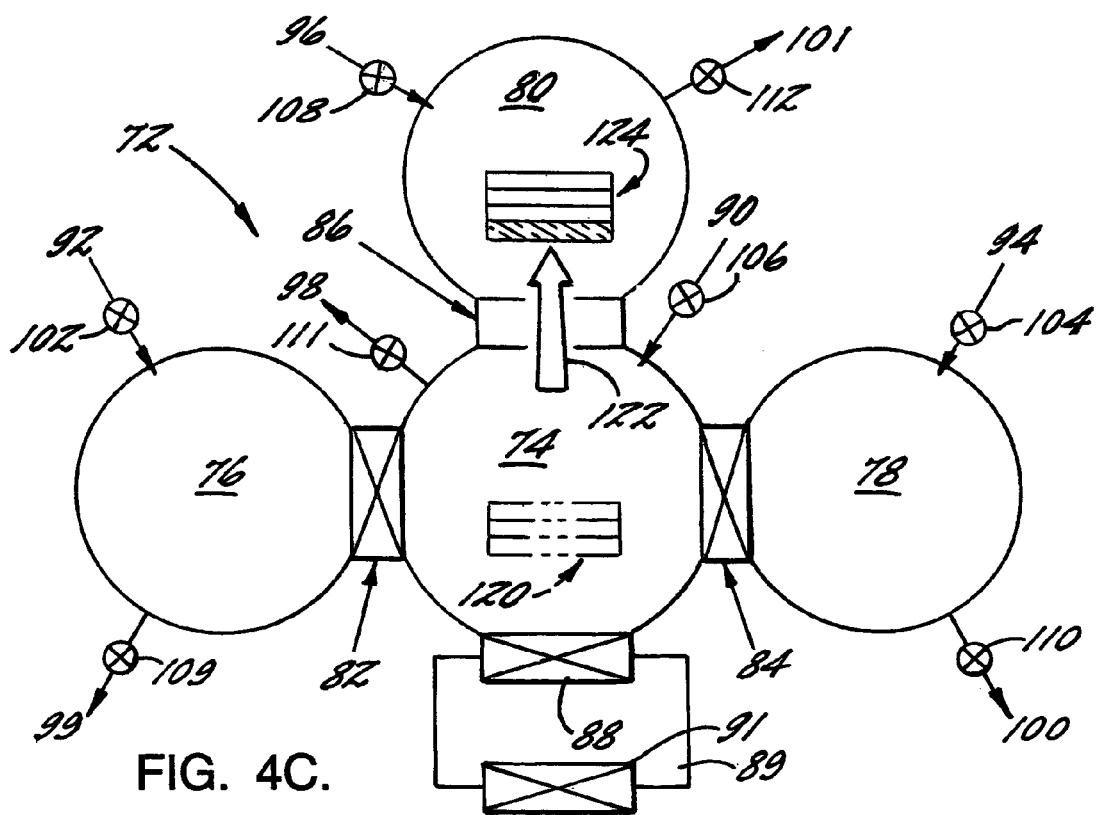

In another embodiment, the additional n-GaN layer 70 depicted in FIG. 3 is deposited in a third deposition chamber. FIGS. 4A-4C are schematic illustrations of an apparatus 72 according to the present invention for forming multilayer devices and a method of its use. The apparatus 72 includes a transfer chamber 74 in communication with each of three chemical vapor deposition chambers 76, 78, 80. The apparatus 72 also includes three isolation valves 82, 84, 86 each in communication with one of the CVD chambers 76, 78, 80 and the transfer chamber 74; a loading valve 88 in communication with the transfer chamber 74, and a load lock chamber 89. The load lock chamber 89 may be a glove box purged with dry gas (i.e., $N_2$, Ar) or a vacuum chamber that can be purged prior to opening the loading valve 88. An input valve 91 in communication with the load lock chamber 89 is included, as well as a transfer means 84 and at least one gas inlet 90. The isolation valves 82, 84, 86; the loading valve 88; and the input valve 91 are capable of being selectively opened and closed, allowing the chambers 74, 76, 78, 80 to be isolated one from the other. The apparatus 72 depicted in FIGS. 4A-4C includes 4 gas inlets 90, 92, 94, 96. Each gas inlet 90, 92, 94, 96 preferably includes a valve 102, 104, 106, 108 to open or close the inlet 90, 92, 94, 96 as desired. Gas inlets include, but are not limited to, a transfer chamber inlet 90, and reaction chamber inlets 92, 94, 96. The apparatus also preferably includes a transfer chamber exhaust 98 and reaction chamber exhausts 99, 100, 101. Each exhaust 98, 99, 100, 101 preferably includes a valve 109, 110, 111, 112 to open or close the exhaust 98, 99, 100, 101 as desired. It should be noted that the apparatus 72 could also contain additional chambers, such as deposition chambers, cooling chambers, or other chambers known in the art as well as additional or fewer inlets and exhausts.

In an embodiment of the present invention, a wafer 114, for example a SiC wafer, is placed in a load lock chamber 89 via an input valve 91 while the loading valve 88 remains in a closed position. The after 114 may optionally be located on a wafer carrier. After the wafer 114 is placed in the load lock chamber 89, the input valve 91 is closed, and the load lock chamber 89 is purged with, for example, $N_2$, to remove $O_2$ and moisture, along with any other impurities, from the load lock chamber 89. the wafer 114 is then placed in a transfer chamber 74 via a loading valve 88 while the isolation valves 82, 84, 86 are closed. More than one wafer may be transferred at this time. As depicted in FIG. 4A, the second and third chambers 78, 80 are isolated from the transfer chamber 74 by closing the isolation valves 84, 86, and the wafer 114 is transferred to the first chamber 76 while maintaining an appropriate ambient as discussed herein. After the wafer 114 is transferred to the first chamber 76, the isolation valve 82 between the first chamber 76 and the transfer chamber 74 is preferably closed during processing. An epitaxial layer, for example an n-type epitaxial layer, is then deposited on the wafer 116 by chemical vapor deposition in the first chamber 76.

After deposition, the first chamber 76 is purged to reduce vapor deposition source gases and dopants remaining in the chamber 76 after deposition and the processed substrate 116 is transferred to the transfer chamber 74 through the isolation valve 82 while minimizing growth stop effects. Growth stop effects are minimized by utilizing appropriate ambients, such as $H_2$, $N_2$, noble gases, or Group V gases. Pressures suitable to vapor deposition growth techniques may also be utilized. During transfer, the isolation valves 84, 86 between the transfer chamber 74 and the second and third chambers 78, 80 remain closed to prevent relevant dopant gases present in the first chamber 76 from entering the second and third chambers 78, 80 and affecting later deposition in the second and third chambers 78, 80.

The deposition of a second epitaxial layer is depicted in FIG. 4B. As seen in the figure, the isolation valves 82, 86 between the transfer chamber 74 and the first and third chambers 76, 80 are closed and the isolation valve 84 between the transfer chamber 74 and the second chamber 78 is opened. The wafer 116 is then transferred via a transferring means 118 into the second chamber 78. After the wafer 116 is transferred to the second chamber 78, the isolation valve 84 between the second chamber 78 and the transfer chamber 74 is preferably closed during processing. An epitaxial layer, for example a p-type epitaxial layer, is then deposited on the first epitaxial layer by chemical vapor deposition in the second chamber 78.

After deposition, the second chamber 78 is purged to reduce the presence of vapor deposition gases and dopants remaining in the chamber 78 after deposition, and the resulting device 120 is transferred to the transfer chamber 74 through the isolation valve 84 while minimizing growth stop effects. Growth stop effects are minimized by utilizing appropriate ambients, such as $H_2$, $N_2$, noble gases, or Group V gases. Pressures suitable to vapor deposition growth techniques may also be utilized. During transfer, the isolation valve 82, 86 between the transfer chamber 74 and the first and third chambers 76, 80 remain closed to prevent relevant dopant gases present in the second chamber 78 from entering the first and third chambers 76, 80 and affecting later deposition.

The deposition of a third epitaxial layer is depicted in FIG. 4C. As seen in the figure, the isolation valves 82, 84 between the transfer chamber 74 and the first and second chambers 76, 78 are closed and the isolation valve 86 between the transfer chamber 74 and the third chamber 80 is opened. The wafer 120 is then transferred via a transferring means 122 into the third chamber 80. After the wafer 120 is transferred to the third chamber 80, the isolation valve 86 between the third chamber 80 and the transfer chamber 74 is preferably closed during processing. An epitaxial layer, for example an n-type epitaxial layer, is then deposited on the first epitaxial layer by chemical vapor deposition in the third chamber 80.

After deposition, the third chamber 80 is purged to reduce the presence of vapor deposition gases and dopants remaining in the chamber 80 after deposition, and the resulting device 124 is transferred to the transfer chamber 74 through the isolation valve 86 while minimizing growth stop effects. Growth stop effects may be minimized by utilizing appropriate ambients, such as $H_2$, $N_2$, noble gases, or Group V gases if additional deposition steps are to be conducted. Pressures suitable to vapor deposition growth techniques may also be utilized. During transfer, the isolation valves 82, 84 between the transfer chamber 74 and the first and second chambers 76, 78 remain closed to prevent relevant dopant gases in the third chamber 80 from entering the first and second chambers 76, 78 and affecting later deposition.

Preferred carrier (or flow) gases include noble gases, nitrogen, argon, and hydrogen. Preferred Group III source gases for the formation of Group III-V epitaxial layers are trimethyl gallium, triethyl gallium, gallium halides, diethyl gallium halide, trimethyl aluminum, triethyl aluminum, aluminum halides, diethyl aluminum halide, trimethyl indium, triethyl indium, indium halides, diethyl indium halide, trimethyl amine alane and mixtures thereof. Other Group III source gases known in the art are also contemplated as suitable for use in the present invention. Preferred Group V sources gases for the formation of Group III-V epitaxial layers are selected from the group consisting of ammonia, arsine, phosphine, symmetrical dimethyl hydrazine, unsymmetrical dimethyl hydrazine, t-butyl hydrazine, arsenic and phosphorous equivalents thereof, and mixtures thereof. Other Group V source gases known in the art are also contemplated as suitable for use in the present invention. When trimethylgallium and ammonia are selected as the reactant gases, the resulting epitaxial layers are GaN layers. While the invention has been described with reference to Group III-V epilayers, other epilayers known in the art are also contemplated as suitable for use in devices formed in accordance with the present invention.

The epitaxial layers may be selectively doped or undoped. Each chemical vapor deposition chamber is preferably dedicated for use with a single dopant gas or combination of dopant gases, such as where the chamber is to be used to deposit co-doped layers (e.g. GaN doped with both Si and Zn). By dedicating each chemical vapor deposition chamber to a single dopant, reactant memory in the resulting devices is reduced. Dopants are selected for their acceptor or donor capabilities. Donor dopants are those with n-type conductivity and acceptor dopants are those with p-type conductivity. With reference to Group III-V epilayers, suitable p-type dopants are selected from (but not necessarily limited to) the group consisting of Be, Mg, Zn, Ca, Mn, Sr, C, and mixtures thereof. Also with reference to Group III-V epilayers, suitable n-type dopants are selected from the group consisting of Si, Ge, Sn, S, Se, and Te, and mixtures thereof. The dopants are supplied to the system via the use of dopant gas sources containing the desired dopant atoms. Of course, if epilayers other than Group III-V layers are implemented, suitable p-type and n-type dopants for those layers are also contemplated in the method of the present invention.

The epitaxial layers deposited in accordance with the present invention may each be independently formed of the same or different Group III-V compounds. When the different layers are formed of the same Group III-V compound, they may be doped differently. Although each deposition chamber is preferably dedicated to a single dopant atom, the Group III and Group V reactant gases may be varied in the individual deposition chambers during deposition. The Group III and Group V reactant gases may also be varied within a particular chamber during distinct deposition processing steps.

The apparatus of the present invention includes a single gas system, the same gas system, similar gas systems, or separate gas systems. Separate gas systems for maximizing throughput are especially preferred. Moreover, the use of a transfer chamber enables transfers between different ambients, including vacuum, $N_2/H_2$, noble gas, and Group V overpressure.

As previously discussed, the present apparatus is not limited to three CVD processing chambers. The apparatus may include as many processing chambers as allowed by cost, space, and need constraints.

In an alternative embodiment, when more dopants are required than there are dedicated processing chambers, a bake-out step may be conducted in one chamber while deposition is occurring in a different deposition chamber. Alternative steps for removing memory effects in a growth deposition chamber include coating, etching, and/or purging the relevant chamber while deposition occurs in a different chamber. The process allows deposition to continue without growth stop effects and loss of processing time during the bake-out procedure. Moreover, additional dopants may be introduced into different layers of the device as desired.

In another embodiment, multiple deposition growth steps may occur simultaneously in different growth chambers. For example, while an n-type layer is being deposited on a substrate in a first deposition chamber 24, a p-type layer could be deposited on a different substrate in a second deposition chamber 26. Distinct deposition steps could be carried out in each of the deposition chambers simultaneously. Moreover, the start and stop times of the deposition steps can be the same or different for each deposition chamber. Additionally, more than one wafer may be present in any deposition chamber during epitaxial growth or in the transfer chamber.

In the drawings and specification, there have been disclosed typical embodiments of the invention, and, although specific terms have been employed, they have been used in a generic and descriptive sense only and not for purposes of limitation, the scope of the invention being set forth in the following claims.

The invention claimed is:

1. A method of conducting multiple step multiple chamber vapor deposition while avoiding reactant memory in the relevant reaction chambers, the method comprising:
   depositing a layer of a first semiconductor material on a substrate using vapor deposition in a first deposition chamber;
   purging the first deposition chamber to reduce vapor deposition source gases remaining in the first deposition chamber following the deposition growth and prior to opening the chamber;
   transferring the substrate to a second deposition chamber while isolating the first deposition chamber from the second deposition chamber to thereby prevent reactants present in the first chamber from affecting deposition in the second chamber and while maintaining the substrate in an ambient that minimizes or eliminates growth stop effects;
   thereafter depositing a second layer of a different semiconductor material on the substrate in the second chamber using vapor deposition;
   purging the second deposition chamber to reduce vapor deposition source gases remaining in the second deposition chamber following the deposition growth and prior to opening the second deposition chamber;
   transferring the substrate to the first deposition chamber while isolating the second deposition chamber from the first deposition chamber to thereby prevent reactants present in the second chamber from affecting deposition in the first deposition chamber and while maintaining the substrate in an ambient that minimizes or eliminates growth stop effects; and
   thereafter depositing an additional layer of the first semiconductor material on the second deposited layer in the first chamber using vapor deposition.

2. A deposition method according to claim 1 wherein the step of depositing a different semiconductor material comprises depositing the same material with a different dopant.

3. A deposition method according to claim 1 wherein the step of transferring the substrate from the first deposition chamber while isolating the chambers comprises:
   transferring the substrate from the first deposition chamber to a transfer chamber while isolating the second deposition chamber from the transfer chamber; and
   thereafter transferring the substrate from the transfer chamber to the second deposition chamber while isolating the first deposition chamber from the transfer chamber.

4. A deposition method according to claim 1 wherein the step of transferring the substrate from the second deposition chamber while isolating the chambers comprises:
   transferring the substrate from the second deposition chamber to a transfer chamber while isolating the first deposition chamber from the transfer chamber; and
   thereafter transferring the substrate from the transfer chamber to the first deposition chamber while isolating the second deposition chamber from the transfer chamber.

5. A deposition method according to claim 1 further comprising transferring the substrate to a third deposition chamber while isolating the first and second deposition chambers from the third deposition chamber to thereby prevent reactants present in the first and second chamber from affecting deposition in the third chamber and while maintaining an ambient that minimizes or eliminates growth stop effects; and
   thereafter depositing a third layer of semiconductor material on the previously deposited layers in the third chamber using vapor deposition.

6. A deposition method according to claim 5 wherein the step of depositing a third layer of semiconductor material comprises depositing a semiconductor material that is different from only one of the previously deposited materials.

7. A method according to claim 1 comprising supplying gas to the deposition chambers using a singe gas system, thereby providing a constant atmosphere in each of the deposition chambers and the transfer chamber, to allow for faster transfer times.

8. A deposition method according to claim 1 comprising supplying gas to the deposition chambers from different gas systems, thereby providing distinct atmospheres in each of the deposition chambers.

9. A deposition method according to claim 8 comprising introducing Group V source gases selected from the group consisting of ammonia, arsine, phosphine, symmetrical dimethyl hydrazine, unsymmetrical dimethyl hydrazine, t-butyl hydrazine, arsenic and phosphorous equivalents thereof, and mixtures thereof, and mixtures thereof, and depositing a Group Ill-V semiconductor material.

10. A deposition method according to claim 8 comprising introducing Group III source gases selected from the group consisting of trimethyl gallium, triethyl gallium, gallium halides, diethyl gallium halide, trimethyl aluminum, triethyl aluminum, aluminum halides, diethyl aluminum halide, trimethyl indium, triethyl indium, indium halides, diethyl indium halide, trimethyl amine alane, and mixtures thereof, and thereby depositing a Group Ill-V semiconductor material.

11. A deposition method according to claim 1 wherein the step of depositing a layer of semiconductor material on a substrate using vapor deposition in a first deposition chamber comprises introducing a source gas and an n-type dopant gas including atoms selected from the group consisting of Si, Ge, Sn, S, Se, Te, and mixtures thereof into the first deposition chamber.

12. A deposition method according to claim 1 wherein the step of depositing a layer of semiconductor material on a substrate using vapor deposition in a second deposition chamber comprises introducing a source gas and a p-type dopant gas including atoms selected from the group consisting of Be, Mg, Zn, Ca, Mn, Sr, C, and mixtures thereof into the second deposition chamber.

13. A deposition method according to claim 1 wherein the step of depositing a layer of semiconductor material on a previously deposited layer using vapor deposition in a second deposition chamber comprises introducing a source gas and a p-type dopant gas including atoms selected from the group consisting of Be, Mg, Zn, Ca, Mn, Sr, C, and mixtures thereof into the second deposition chamber.

14. A deposition method according to claim 1 wherein the step of depositing a layer of semiconductor material on a previously deposited layer using vapor deposition in a second deposition chamber comprises introducing a source gas and a n-type dopant gas including atoms selected from the group consisting of Si, Ge, Sn, S, Se, Te, and mixtures thereof into the second deposition chamber.

15. A deposition method according to claim 1 wherein the step of depositing a third layer of semiconductor material on a second deposited layer using vapor deposition in a first deposition chamber comprises introducing a source gas and a p-type dopant gas including atoms selected from the group consisting of Be, Mg, Zn, Ca, Mn, Sr, C, and mixtures thereof into the first deposition chamber.

16. A deposition method according to claim 1 wherein the step of depositing a third layer of semiconductor material on a second deposited layer using vapor deposition in a first deposition chamber comprises introducing a source gas and a n-type dopant gas including atoms selected from the group consisting of Si, Ge, Sn, S, Se, Te, and mixtures thereof into the first deposition chamber.

17. A deposition method according to claim 1 wherein the substrate is located on a wafer carrier.

18. A deposition method according to claim 17 wherein more than one substrate is located on the wafer carrier.

19. A deposition method according to claim 17 wherein the substrate is transferred to a second wafer carrier.

20. A deposition method according to claim 18 wherein each substrate on the wafer carrier is transferred to a second wafer carrier.

21. A deposition method according to claim 1 wherein more than one substrate is being processed.

22. A deposition method according to claim 21 wherein at least one substrate is at a different processing stage than at least one other substrate.

23. A method of conducting multiple step multiple chamber vapor deposition while avoiding reactant memory in the relevant reaction chambers, the method comprising:
  depositing a layer of semiconductor material on a substrate using vapor deposition in a first deposition chamber;
  purging the first deposition chamber to reduce vapor deposition source gases remaining in the first deposition chamber following the deposition growth and prior to opening the chamber;
  transferring the substrate to a second deposition chamber while isolating the first deposition chamber from the second deposition chamber to thereby prevent reactants present in the first chamber from affecting deposition in the second chamber and while maintaining the substrate in an ambient that minimizes or eliminates growth stop effects;
  thereafter depositing a second layer of a different semiconductor material on the first deposited layer in the second chamber using vapor deposition while baking out the first deposition chamber to remove any reactants present from the first deposition step;
  purging the second deposition chamber to reduce vapor deposition source gases remaining in the second deposition chamber following the deposition growth and prior to opening the chamber;
  transferring the substrate to the first deposition chamber while isolating the second deposition chamber from the first deposition chamber to thereby prevent reactants present in the second chamber from affecting deposition in the first chamber and while maintaining the substrate in an ambient that minimizes or eliminates growth stop effects; and
  thereafter depositing an additional layer of a third semiconductor material on the second deposited layer in the first chamber using vapor deposition.

24. A deposition growth method according to claim 23 wherein the step of transferring the substrate while isolating the chambers comprises:
  transferring the substrate from the first deposition chamber to a transfer chamber while isolating the second deposition chamber from the transfer chamber; and
  hereafter transferring the substrate from the transfer chamber to the second deposition chamber while isolating the first deposition chamber from the transfer chamber.

25. A deposition growth method according to claim 23 wherein the respective deposition steps comprise supplying gas to the deposition chambers using a single gas system, thereby providing a constant atmosphere in each of the deposition chambers and the transfer chamber, to allow for faster transfer times.

26. A deposition growth method according to claim 23 wherein the respective deposition steps comprise supplying gas to the deposition chambers from different gas systems, thereby providing distinct atmospheres in each of the deposition chambers.

27. A deposition method according to claim 23 wherein the respective deposition steps comprise introducing Group V source gases selected from the group consisting of ammonia, arsine, phosphine, symmetrical dimethyl hydrazine, unsymmetrical dimethyl hydrazine, t-butyl hydrazine, arsenic and phosphorous equivalents thereof, and mixtures thereof, and depositing a Group Ill-V nitride semiconductor material.

28. A deposition method according to claim 23 wherein the respective deposition steps comprise introducing Group III source gases selected from the group consisting of trimethyl gallium, triethyl gallium, gallium halides, diethyl gallium halide, trimethyl aluminum, triethyl aluminum, aluminum halides, diethyl aluminum halide, trimethyl indium, triethyl indium, indium halides, diethyl indium halide, trimethyl amine alane, and mixtures thereof, and thereby depositing a Group Ill-V semiconductor material.

29. A deposition method according to claim 23 wherein the step of depositing a layer of semiconductor material on a substrate using vapor deposition in a first deposition chamber comprises introducing a source gas and an n-type dopant gas including atoms selected from the group consisting of Si, Ge, Sn, S, Se, Te, and mixtures thereof into the first deposition chamber.

30. A deposition method according to claim 23 wherein the step of depositing a layer of semiconductor material on a substrate using vapor deposition in a first deposition chamber comprises introducing a source gas and a p-type dopant gas including atoms selected from the group consisting of Be, Mg, Zn, Ca, Mn, Sr, C, and mixtures thereof into the first deposition chamber.

31. A deposition method according to claim 23 wherein the step of depositing a layer of semiconductor material on a substrate using vapor deposition in a second deposition chamber comprises introducing a source gas and a p-type dopant gas including atoms selected from the group consisting of Be, Mg, Zn, Ca, Mn, Sr, C, and mixtures thereof into the second deposition chamber.

32. A deposition method according to claim 23 wherein the step of depositing a layer of semiconductor material on a substrate using vapor deposition in a second deposition chamber comprises introducing a source gas and a n-type dopant gas including atoms selected from the group consisting of Si, Ge, Sn, S, Se, Te, and mixtures thereof into the second deposition chamber.

33. A deposition growth method according to claim 23 wherein the step of depositing a third layer of semiconductor material on a substrate using vapor deposition in the first deposition chamber comprises introducing a source gas and a p-type dopant gas including atoms selected from the group consisting of Be, Mg, Zn, Ca, Mn, Sr, C, and mixtures thereof into the first deposition chamber.

34. A deposition growth method according to claim 23 wherein the step of depositing a third layer of semiconductor material on a substrate using vapor deposition in the first deposition chamber comprises introducing a source gas and an n-type dopant gas including atoms selected from the group consisting of Si, Ge, Sn, S, Se, Te, and mixtures thereof into the first deposition chamber.

35. A deposition method according to claim 23 wherein the substrate is located on a wafer carrier.

36. A deposition method according to claim 35 wherein more than one substrate is located on the wafer carrier.

37. A deposition method according to claim 35 wherein the substrate is transferred to a second wafer carrier.

38. A deposition method according to claim 23 wherein more than one substrate is being processed.

39. A deposition method according to claim 38 wherein at least one substrate is at a different processing stage than at least one other substrate.

40. A method of conducting multiple step multiple chamber vapor deposition while avoiding reactant memory in the relevant reaction chambers, the method comprising:
  depositing a layer of semiconductor material on a substrate using vapor deposition in a first deposition chamber
  purging the first deposition chamber to reduce vapor deposition source gases remaining in the first deposition chamber following the deposition growth and prior to opening the chamber;
  transferring the substrate to a second deposition chamber while isolating the first deposition chamber from the second deposition chamber to thereby prevent reactants present in the first chamber from affecting deposition in the second chamber and while maintaining the substrate in an ambient that minimizes or eliminates growth stop effects;
  thereafter depositing an additional layer of a different semiconductor material on the first deposited layer in the second chamber using vapor deposition;
  thereafter transferring the substrate to a third deposition chamber while isolating the first and second deposition chambers from the third deposition chamber to thereby prevent reactants present in the first and second chamber from affecting deposition in the third chamber and while maintaining the substrate in an ambient that minimizes or eliminates growth stop effects; and
  thereafter depositing an additional layer of a different semiconductor material on the substrate in the third chamber using vapor deposition in which the additional layer is different from only one of the previously deposited materials.

41. A method of conducting multiple step multiple chamber vapor deposition while avoiding reactant memory in the relevant reaction chambers, the method comprising:
  depositing a layer of semiconductor material on more than one substrate on a wafer carrier using vapor deposition in a first deposition chamber;
  purging the first deposition chamber to reduce vapor deposition source gases remaining in the first deposition chamber following the deposition growth and prior to opening the chamber;
  transferring the substrates to a second deposition chamber on a second wafer carrier while isolating the first deposition chamber from the second deposition chamber to thereby prevent reactants present in the first chamber from affecting deposition in the second chamber and while maintaining the substrate in an ambient that minimizes or eliminates growth stop effects;
  thereafter depositing an additional layer of a different semiconductor material on the first deposited layer in the second chamber using vapor deposition.

* * * * *